(12) United States Patent
Basheer et al.

(10) Patent No.: US 7,504,460 B2
(45) Date of Patent: Mar. 17, 2009

(54) COMPOSITION OF AROMATIC OR CYCLOALIPHATIC AMINE-DERIVED POLYEPOXIDE AND POLYAMINE

(75) Inventors: Rafil A. Basheer, Rochester Hills, MI (US); Mohamed Bouguettaya, Sterling Heights, MI (US)

(73) Assignee: Delphi Technologies, Inc., Troy, MI (US)

( * ) Notice: Subject to any disclaimer, the term of this patent is extended or adjusted under 35 U.S.C. 154(b) by 266 days.

(21) Appl. No.: 11/216,942

(22) Filed: Aug. 31, 2005

(65) Prior Publication Data

US 2006/0197236 A1    Sep. 7, 2006

(51) Int. Cl.
*C08L 63/00* (2006.01)
*H01L 21/56* (2006.01)
*H01L 23/29* (2006.01)

(52) U.S. Cl. .................. 525/523; 257/793; 438/127
(58) Field of Classification Search ................ None
See application file for complete search history.

(56) References Cited

U.S. PATENT DOCUMENTS

| | | | | |
|---|---|---|---|---|
| 6,166,849 A | * | 12/2000 | Coleman et al. | 359/270 |
| 7,060,761 B2 | * | 6/2006 | Arai et al. | 525/476 |
| 7,070,670 B2 | * | 7/2006 | Tomiyama et al. | 156/248 |
| 7,332,822 B2 | * | 2/2008 | Basheer et al. | 257/787 |
| 2006/0199301 A1 | * | 9/2006 | Basheer et al. | 438/106 |
| 2008/0122118 A1 | * | 5/2008 | Basheer et al. | 257/778 |

FOREIGN PATENT DOCUMENTS

| | | |
|---|---|---|
| EP | 0 411 834 | 2/1991 |
| EP | 0 588 120 | 3/1994 |
| EP | 1 454 936 | 9/2004 |
| EP | 1 657 742 | 5/2006 |
| JP | 2000-19537 A * | 1/2000 |

* cited by examiner

*Primary Examiner*—Robert Sellers
(74) *Attorney, Agent, or Firm*—Paul L. Marshall

(57) ABSTRACT

Disclosed is a curable composition having a low CTE. In one embodiment, a curable composition is disclosed that comprises (i) a binder comprising at least one epoxy compound of the structure:

$$X-((CH_2)_m-(N)-((CH_2)_n-(Z))_2)_p$$

wherein X is an aromatic ring or a six membered cycloaliphatic ring, m is from about 0 to about 2, n is from about 1 to about 3, Z is an epoxy group of empirical formula: $C_2H_3O$, p is a number from about 2 to about 3, and (ii) a cross-linking agent comprising at least one polyamine. This curable composition is characterized by a CTE of no more than 60 ppm/° C. when cured for a time of from about 20 to about 60 minutes at temperature of from about 100 to 240° C. Also disclosed are methods of making integrated circuits and integrated circuits made there from, especially flip chips.

7 Claims, 3 Drawing Sheets

COMPOSITION OF AROMATIC OR CYCLOALIPHATIC AMINE-DERIVED POLYEPOXIDE AND POLYAMINE

FIELD OF THE INVENTION

The invention relates to curable compositions that upon curing produce a three dimensional cross-linked matrix having a low coefficient of thermal expansion. More particularly, the invention relates to curable compositions useful in the production of integrated circuits, especially flip chip integrated circuits, methods of making such circuits, and circuits made there from.

BACKGROUND OF THE INVENTION

Integrated circuits or integrated circuit assemblies are employed in a wide variety of electronic applications. Increasing demand for high performance yet reliable electronic products that are ever smaller, lighter, and cost effective have led to corresponding demands on the manufacturers of integrated circuits.

Such circuits have traditionally employed a circuit board and a die connected by a plurality of connectors, wires and/or solder bumps. It has been known that differences between the coefficients of thermal expansion (CTE) of the circuit board and die contribute to early fatigue failure of solder interconnects, especially during thermal cycling of the circuit assembly. Differences in CTE are especially problematic for integrated circuits used in environments subjected to high temperatures, such as applications in close proximity to internal combustion engines, i.e., on board motor vehicle applications.

Epoxy resins have been used in the manufacture of integrated circuits. In some cases, such resins have functioned to anchor or adhere various components of the circuit and/or to mitigate the differences between the CTE's of the components of the circuit.

For example, epoxy resins have been utilized as under fill materials in the manufacture of integrated circuits having a flip-chip construction, i.e., 'flip chips'. Under fill materials are intended to support and protect the electrical connections of the flip chip while simultaneously reducing the thermomechanical stress on the flip chip connections.

However, prior art epoxy resins have generally been unable to provide cured under fill materials having a desirably low CTE. Epoxy resins having a CTE of 60 ppm/° C. are especially advantageous in mitigating the differences between the CTEs of the die and circuit board. Suitable epoxy resins have often been achieved only with the use of significant amounts of CTE reducing fillers.

Unfortunately, the use of such fillers has traditionally resulted in increased manufacturing challenges and problems.

For example, circuit-manufacturing processes using capillary flow under fill technology typically require the injection of an epoxy resin based under fill composition into the interstitial spaces of an integrated circuit assembly. The presence of CTE reducing fillers in such compositions can result in an increased viscosity that impedes the flow and distribution of the under fill composition. Such processes are also often characterized as unacceptably long and/or costly.

In no flow under fill processes the epoxy based under fill material is typically applied to the surface of an integrated circuit substrate. To join a die to the substrate, the die's flip chip bumps are pushed through the under fill material until the flip chip bumps make contact with corresponding substrate bumps. In this case, filler particles can become undesirably trapped between the corresponding flip chip bumps and substrate bumps.

Thus, epoxy resin based compositions having low amounts of CTE reducing fillers are advantageous as compared to those having greater amounts of CTE reducing filler.

In addition, epoxy resins useful in the construction of integrated circuits must also have a reaction profile that accommodates the reflow profile of the solder used therein. In particular, it would advantageous if the solder reflowed before substantial crosslinking of the epoxy resin occurs. However, crosslinking must progress quickly once solder reflow has occurred.

Accordingly, it can be seen that prior art epoxy resins have failed to resolve challenges associated with the design and manufacture of integrated circuits, especially flip chips.

SUMMARY OF THE INVENTION

Figure 1:
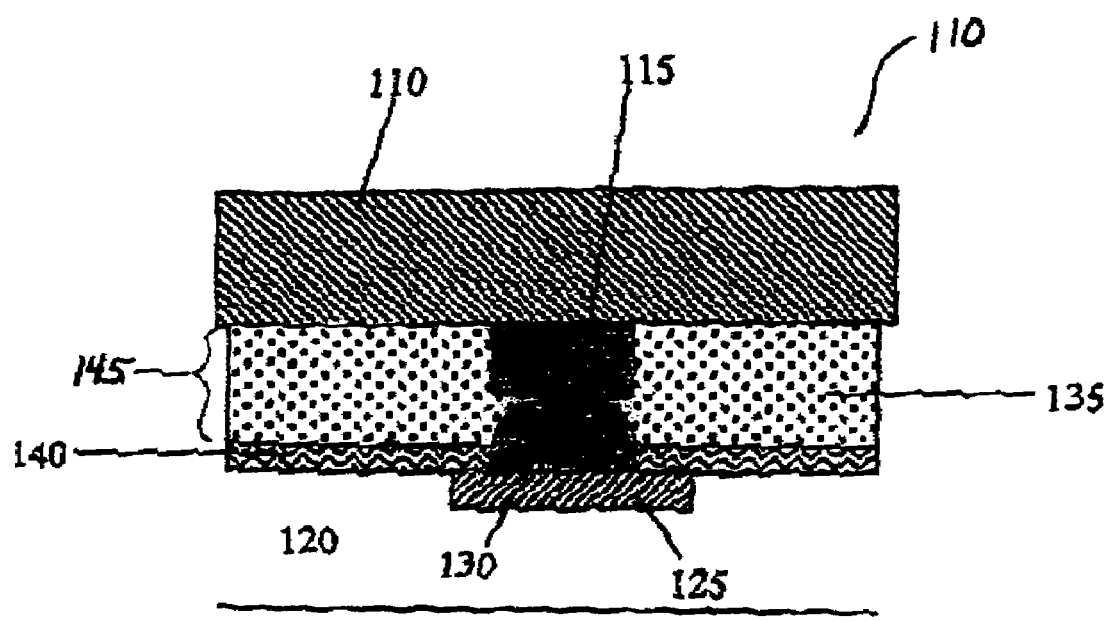
FIG. 1 is a cross-sectional view of one embodiment of the disclosed integrated circuit assembly.

Disclosed is a curable composition having a low coefficient of thermal expansion (CTE). In one embodiment, a curable composition is disclosed that comprises (i) a binder comprising at least one epoxy compound of the structure:

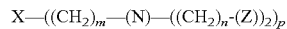

wherein X is an aromatic ring or a six membered cycloaliphatic ring, m is from about 0 to about 2, n is from about 1 to about 3, Z is an epoxy group of empirical formula: $C_2H_3O$, p is a number from about 2 to about 3, and (ii) a cross-linking agent comprising at least one polyamine having from 2 to 4 primary amine groups. This curable composition is characterized by a CTE of no more than 60 ppm/° C. when cured for a time of from about 10 to about 60 minutes at temperature of from about 150 to 240° C.

The disclosed curable composition is useful in the manufacture of integrated circuits, especially integrated circuits having a 'flip-chip' construction. In one embodiment, the disclosed method of making an IC assembly comprises applying the disclosed curable composition to a substrate, placing a die in communication with the applied composition, and curing the applied composition to provide an assembly, wherein at least one of the substrate or die comprises one or more bumps. Also disclosed are integrated circuits made by the disclosed method.

In another embodiment, an integrated circuit assembly is disclosed that comprises a substrate comprising one or more substrate bumps, a die having an active side comprising one or more flip chip bumps, said die being in communication with the substrate such that the substrate bumps are joined to the flip chip bumps, and a cured composition in communication with the substrate and the die, and surrounding the joined bumps, the cured composition having a CTE of no more than 60 ppm/° C. and comprising the reaction product of a binder (i) comprising at least one epoxy compound of the structure:

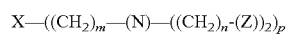

wherein X is an aromatic ring or a six membered cycloaliphatic ring, m is from about 0 to about 2, n is from about 1 to about 3, Z is an epoxy group of the empirical formula: $C_2H_3O$, p is a number from about 2 to about 3, and a cross-linking agent (ii) comprising at least one polyamine.

Also disclosed is a method of making an integrated circuit that comprises in one embodiment, providing a substrate comprising one or more substrate bumps, applying a curable composition to the substrate, said curable composition comprising (i) a binder comprising at least one epoxy compound of the structure:

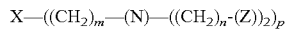

wherein X is an aromatic ring or a six membered cycloaliphatic ring, m is from about 0 to about 2, n is from about 1 to about 3, Z is an epoxy group of the empirical formula: $C_2H_3O$, p is a number from about 2 to about 3, and (ii) a cross-linking agent comprising at least one polyamine, placing a die on the applied curable composition, said die comprising one or more flip chip bumps, subjecting the assembly to a temperature sufficient to cause flow of the bumps and the formation of an interconnection between the substrate and flip chip bumps, and subjecting the assembly to a temperature sufficient to cause curing of the applied curable composition.

DETAILED DESCRIPTION OF THE PREFERRED EMBODIMENTS

The singular forms "a", "an" and "the" include plural referents unless the context clearly dictates otherwise.

"Optional" or "optionally" means that the subsequently described event or circumstance may or may not occur, and that the description includes instances where the event occurs and instances where it does not.

The modifier "about" used in connection with a quantity is inclusive of the stated value and has the meaning dictated by the context (e.g., includes the degree of error associated with measurement of the particular quantity).

The disclosed curable compositions generally comprise a binder (i) and a crosslinking agent (ii). In one embodiment, the disclosed curable compositions are useful as under fill materials in integrated circuits, especially flip chips.

'Curable' as used herein refers to thermoset compositions that can, when subjected to appropriate energy, cure to form a three dimensional cross linked matrix. In one embodiment, the curable compositions will crosslink upon the application of sufficient thermal energy.

It will be appreciated that the obtainment of low CTEs has been particularly difficult to obtain with regards to epoxy based compositions useful as under fill materials in integrated circuits. More particularly, those of skill in the art will appreciate that numerous competing factors affect the obtainment of curable compositions that result in cured compositions having a low CTE. Such factors include but are not limited to cross link density, rigidity, molecular packing, steric hindrance, and reaction kinetics. Those of skill in the art have been unable to conclusively identify which factor will weight most heavily in any particular composition. Thus, it will be appreciated that it has been difficult to reliably formulate epoxy based compositions that cure to provide under fill materials having a low CTE for a given curing profile especially for under fill materials that are substantially free of traditional CTE adjusting fillers.

It has now been found that in one embodiment, the use of a particular binder (i) and a polyamine can contribute to the production of cured compositions having low CTEs. In one exemplary embodiment, it has been found that a curable composition comprising a particular binder (i) and a particular polyamine (ii) provides a cured composition having a low CTE.

The binder (i) of the disclosed curable composition will comprise at least one particular epoxy compound of the structure:

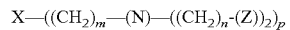

wherein X comprises an aromatic ring or a six membered cycloaliphatic ring containing structure, m is from about 0 to about 2, n is from about 1 to about 3, Z is an epoxy group of the empirical formula: $C_2H_3O$, and p is a number from about 2 to about 3. In one embodiment, X will be an aromatic ring or a six membered cycloaliphatic ring. In another embodiment, X will be an aromatic ring, while m is from 0 to about 1, and n is from about 1 to 2. In one exemplary embodiment, m is 1, n is 1, and p is 2.

In one embodiment, when p is 2, the substituent groups "—$(CH_2)_m$—(N)—$((CH_2)_n$-(Z))" will be arranged to provide a structure wherein the substituent groups are located in the 1, 3; 1, 2; or 1, 4 positions of the aromatic or cycloahphatric ring in regards to an axis through the X group. In one exemplary embodiment, the substituent groups "—$(CH_2)_m$—(N)—$((CH_2)_n$-(Z))" of the at least one epoxy compound will be arranged in a meta structure, i.e., the 1, 3 structure.

Particularly suitable examples of the at least one epoxy resin include N,N, N',N'-tetraglycidyl-meta-xylenediamine and 1,3-bis(N,N-diglycidylaminomethy)cyclohexamine. Such resins are commercially available from Mistsubishi Gas Chemical Company of Tokyo, Japan as Tetrad™-C and Tetrad™-X or ERISYS™ GA-24O from CVC Speciality Chemicals of Morristown, N.J. In one exemplary embodiment, the at least one epoxy compound will be N,N, N',N'-tetraglycidyl-meta-xylenediamine.

Although the binder (i) may comprise other resins, polymers, and/or copolymers, including other epoxy resins, the binder (i) will comprise at least 50% by weight of the at least one epoxy compound discussed above, based on the total nonvolatile weight of the binder (i). In one embodiment, the binder (i) may comprise no less than 95% by weight of the at least one epoxy compound, while in one exemplary embodiment, the binder (i) will comprise from 80 to 100% by weight of the particular epoxy, based on the total nonvolatile weight of the binder (i). In one exemplary embodiment, the binder (i) will comprise from 98 to 100% by weight of the at least one epoxy, based on the total nonvolatile weight of the binder (i). In another exemplary embodiment, the binder (i) will comprise 100% by weight of the particular epoxy, based on the total nonvolatile weight of the binder (i). Thus, in one exemplary embodiment, binder (i) will consist solely of the at least one epoxy resin having the above identified structure.

Illustrative examples of other resins that may be utilized in the binder (i) include epoxy resins (e.g., bisphenol A resins, bisphenol F resins, cycloaliphatic epoxy resins, and mixtures thereof), cyanate esters, siloxiranes, maleimides, polybenzoxazines, polyimides, novolac based epoxy resins, cresol based epoxy resins, triglycidyl of para, amino phenol epoxy resins tetraglycidyl of diaminodiphenyl methane and the like, as well as mixtures thereof.

The disclosed curable compositions will also comprise a crosslinking agent (ii) comprising at least one polyamine. As discussed above, in one embodiment, it has been found that a curable composition comprising a particular binder (i) and a crosslinking agent (ii) comprising at least one particular polyamine provides a cured composition having a low CTE. That is, in one embodiment, the selection of a particular at least one polymine as a crosslinking agent (ii) is believed to contribute to the obtainment of a curable composition that after curing has a low CTE at a particular curing profile.

In one embodiment, suitable amines may be those polyamines having a structure that contributes to increased cross link density, increased rigidity, and increased molecular packing but which do not possess undesirable degrees of steric hindrance and/or which do not contribute to undesirable reaction kinetics. In this case, suitable polyamines are those having from 2 to 4 primary amine groups, but especially 2 primary amine groups.

Suitable polyamines may also comprise one or more heteroatoms. Illustrative heteroatoms and groups comprising heteroatoms include halogen atoms, O, S, hydroxyl groups, secondary amine groups, ester groups, alkoxy groups, ester groups, ether groups, thiol groups, carbonate groups ($-CO_2$), sulfonate groups ($-SO_2$), mixtures thereof, and the like.

In one especially exemplary embodiment, the at least one polyamine will comprise heteroatoms, especially O.

In one embodiment, crosslinking agent (ii) will comprise at least one polyamine having a structure comprising at least one aromatic ring and from 2 to 4 primary amine groups, but especially 2 primary amine groups. In one exemplary embodiment, the at least one polyamine will have a structure having a molecule having more than 1 aromatic ring, especially more than 2 aromatic rings. In one especially exemplary embodiment, the at least one polyamine will have a structure having a molecule having 3 aromatic rings.

In yet another embodiment, the at least one polyamine will have the structure:

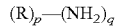

wherein R is at least one of an aromatic ring or a cycloaliphatic ring, $(R_1-W)_k-R_2$, $(R_1-W-R_2)_k$, and combinations thereof, p is from about 1 to about 4, and q is from about 2 to about 4. When R comprises an aromatic ring or cycloaliphatic ring, they may be either substituted or unsubstituted and may or may not comprise heteroatoms or groups comprising heteroatoms as discussed immediately above. Suitable R groups may thus be at least one of a substituted or unsubstituted aromatic ring, a substituted or unsubstituted six membered cycloaliphatic ring, a substituted or unsubstituted heteroaromatic ring, a substituted or unsubstituted six membered cycloheteroaliphatic ring, and combinations thereof. With regard to combinations of such structures, suitable R groups may comprise more than one of each type of structure, i.e., two or more aromatic rings in combination with one or more of the other identified structures.

If substituted, the aromatic ring or cycloaliphatic ring suitable for use in R may comprise one or more substituent groups such as alkyl groups, alkoxy groups, heteroatoms, groups comprising heteroatoms, and mixtures thereof. Suitable alkyl groups and alkoxy groups will generally be those having less than 5 carbon atoms, especially those having from 1 to 3 carbon atoms.

In one exemplary embodiment, R will comprise unsubstituted aromatic rings, especially more than one unsubstituted aromatic ring. In one especially exemplary embodiment, R will comprise three unsubstituted aromatic rings.

In the above structures, $R_1$ and $R_2$ may be the same or different and are defined as R is above, W is at least one of an alkyl group of from 1 to 3 carbons, a heteroatom, a heteroatom containing radical, and combinations thereof, and k is from about 1 to about 4.

In another embodiment, the at least one polyamine will have the structure:

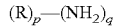

wherein R comprises at least one structure selected from a substituted aromatic ring, an unsubstituted aromatic ring, a substituted heteroaromatic ring, an unsubstituted heteroaromatic ring, and mixtures thereof, p is from about 1 to about 4, and q is from about 2 to about 4, with all terms having the definitions as discussed above.

In one exemplary embodiment, the crossliniking agent (ii) will comprise a polyamine of the structure:

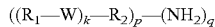

wherein $R_1$ and $R_2$ may be the same or different and are at least one of a substituted aromatic ring, an unsubstituted aromatic ring, a substituted hetero aromatic ring, or an unsubstituted heteroaromatic ring, and combinations thereof, W is at least one of O, S, $SO_2$, $-CO_2$, or combinations thereof, p is from about 1 to about 2, k is from about 1 to about 4, and q is from 2 to about 3.

In one exemplary embodiment, the at least one polyamine will be at least one of 1,3-bis(3-aminophenoxy)benzene, 1,3-bis(4-aminophenoxy)benzene, 1,4-bis(4-aminophenoxy)benzene, 4,4'-diaminodiphenyl sulfide, 2,4-diaminotoluene, 3,4-diaminotoluene, 2,3-diaminotoluene 1,3 phenylenediamine, diaminobenzidine, 1,3-benzenediamine, 4,4'-diaminodiphenyl methane, 1-[(3-aminophenyl)amino]-3-phenoxy, 1-[[4-[(4-aminophenyl)methyl]phenyl]amino]-3-phenoxy, polymeric methylene dianiline, and combinations comprising two or more of the foregoing. In one especially exemplary embodiment, the at least one polyamine will be at least one of 1,3-bis(3-aminophenoxy)benzene, 1,3-bis(4-aminophenoxy)benzene, or 1,4-bis(4-aminophenoxy)benzene.

In one embodiment, the crosslinking agent (ii) may comprise amines and polyamines other than the at least one polyamine discussed above. In one embodiment, the crosslinking agent (ii) will comprise at least 50% by weight of the at least one polyamine discussed above, based on the total nonvolatile weight of the crosslinking agent. In one embodiment, the crosslinking agent (ii) may comprise no less than 95% by weight of the at least one polyamine, while in one exemplary embodiment, the crosslinking agent (ii) will comprise from 80 to 100% by weight of the at least one polyamine, based on the total nonvolatile weight of the crosslinking agent. In one exemplary embodiment, the crosslinking agent (ii) will comprise from 98 to 100% by weight of the particular polyamine, based on the total nonvolatile weight of the crosslinking agent (ii). In another exemplary embodiment, the crosslinking agent (ii) will comprise 100% by weight of the particular polyamine, based on the total nonvolatile weight of the crosslinking agent (ii). Thus, in one exemplary embodiment, crosslinking agent (ii) will consist solely of the at least one polyamine discussed above.

In one exemplary embodiment, the at least one polyamine will be used in a stoichometric or near stoichometric amount relative to the at least one epoxy.

The disclosed curable composition may also comprise a catalyst (iii). Optional catalyst (iii) may be present in an amount of from 0 to 5.0% by weight, based on the total weight of the curable composition. In another embodiment, the catalyst (iii) will be present in an amount of from 0.1 to 5.0% by weight, based on the total weight of the curable composition.

In one exemplary embodiment, the catalyst (iii) will be present in an amount of from 0.2 to 2.0% by weight, based on the total weight of the curable composition. In one especially exemplary embodiment, the catalyst (iii) will be present in an amount of from 0.5 to 1.0% by weight, based on the total weight of the curable composition.

Suitable optional catalysts (iii) are those that affect the desired behavior of the formulation. For instance, catalysts (iii) may be used to promote cross-linking and/or to control the curing time of the resin. In one embodiment, the catalyst (iii) will be a Lewis acid. Suitable examples of catalysts (iii) include salts of trifluoromethane sulfonic acid, $BF_3$/amine complexes, imidazoles, phosphines, dicyanamide, and substituted dicyamide compounds. In one embodiment, the catalyst (iii) will be at least one of a salt of trifluoromethane sulfonic acid or a $BF_3$/amine complex. In one exemplary embodiment, the catalyst (iii) will be a salt of trifluoromethane sulfonic acid.

Examples of suitable salts of trifluoromethane sulfonic acid include, but are not limited, to lithium triflate, amine triflate, and the lanthanide metal series of triflates. A commercially available example of a suitable salt of trifluoromethane sulfonic acid is FC520, a 60% solution of diethylamine triflate, commercially available from 3M of St. Paul, Minn.

In one exemplary embodiment, the catalyst (iii) will comprise at least one of $(CF_3\text{—}SO_3)_n M^{n+}$, $(CF_3\text{—}SO_3)NR^3R^4$, $(BF_3)NR^3R^4$ or mixtures thereof, wherein n is from about 1 to about 2, M is a metal, $R^3$ and $R^4$ may be the same or different and are at least one of H, an alkyl group and mixtures thereof. Suitable alkyl groups include those having from 1 to 20 carbon atoms, with 1 to 6 carbon atoms being particularly suitable. $R_3$ and $R_4$ may also be a fused or cylco alphitic or aromatic ring, that may contain heteratome. M may be any metal, including but not limited to alkali metals, alkali earth metals, transition metals, lanthanide metals, and the like. In one exemplary embodiment, M will be at least one metal selected from Li, Ce, La, Nd, Eu, Yb, and combinations thereof.

In one exemplary embodiment, the catalyst (iii) will be FC520.

In one embodiment, the triflate salts may be added to the curable composition via solution with a polyol such as glycerol. Alternatively, the triflate salt may be added directly (no glycerol) to the curable composition as long as care is taken to insure uniform distribution of the salt in the curable composition.

Prior art epoxy based under fill compositions have often relied upon the use of CTE adjusting fillers to obtain desirable CTEs in the cured under fill compositions. Such fillers have traditionally been used to lower the CTE of the cured under fill composition to more closely approximate the CTEs of the integrated circuit components. Such traditional fillers may be thermally or electrically conductive or nonconductive. Examples of suitable fillers include carbon black, graphite, gold, silver, copper, platinum, palladium, nickel, aluminum, aluminum nitride, silicon carbide, boron nitride, diamond, alumina and combinations thereof. Examples of other suitable fillers include particles of vermiculite, mica, wollastonite, calcium carbonate, titania, sand, glass, silica, fused silica, fumed silica, barium sulfate, and halogenated ethylene polymers, such as tetrafluoroethylene, vinylidene fluoride, vinyl fluoride, vinylidene chloride, vinyl chloride, aluminum hydrates, magnesium hydrates, and combinations of such fillers. A particularly suitable filler is silica or derivatives thereof. "Tradtional" fillers as used here refers to fillers generally having an average particle size of from 1 μm to 100 μm and generally does not include nontraditional fillers characterized as being nanoparticulates or nanopowders. Such fillers have traditionally been used in amounts of from 20 to 90% by weight of the underfill composition, or from 20 to 40% by volume of the underfill composition. In one embodiment, the disclosed curable composition may include such traditional CTE lowering fillers in traditionally used amounts.

However, in another embodiment, the disclosed curable composition will minimize the amount of traditional CTE lowering fillers employed while still providing cured compositions having desirable CTEs. For example, in one embodiment, the disclosed curable compositions will employ from about 0% to less than about 20% by weight of traditional fillers intended to adjust or reduce the CTE of the cured composition, based on the total weight of the curable composition. In another embodiment, the disclosed curable compositions will employ less than about 10% by weight of traditional fillers intended to adjust or reduce the CTE of the cured composition. In one exemplary embodiment, such fillers will be used in an amount of from about 0 to about 5% by weight of the curable composition. In one particularly exemplary embodiment, the disclosed curable composition will be substantially free of traditional CTE adjusting fillers, while still providing a cured composition having a desirable CTE as defined below. 'Substantially free of fillers' as used herein refers to amounts of fillers of from about 0 to about less than 5% by weight, based on the total weight of the disclosed composition.

The disclosed curable composition may optionally comprise one or more optional components such as solvents, additives, accelerators, fluxing agents, coupling agents, toughening agents, diluents, impact modifiers, aliphatic amines, stabilizers, antioxidants, antifoaming agents, adhesion agents, elastomers, flame retardants, and combinations comprising two or more of the foregoing. Such optional components may be used in amounts of from about 0 to 80% by weight, per optional component, based on the total weight of the disclosed curable composition.

Coupling agents may be used in order to improve the adhesion property of the underfill. Examples of suitable coupling agents include silanes, titanates, zirconates, aluminates, silicate esters, metal acrylates or methacrylates, compounds containing a chelating ligand (e.g., phosphine, mercaptan, acetoacetate), and/or mixtures thereof. The kinds and amounts of coupling agents that may be used are known to those skilled in the art. Illustrative amounts of coupling agents are 0 to 5% based on total composition.

Suitable fluxing agents may be acidic, basic, or neutral. Examples of acidic fluxing agents include organic acids such as acrylic acid, heptanoic acid, lauric acid, palmitic acid, and valeric acid. Examples of neutral fluxing agents include alcohols or polyols. Fluxing agents may be used in amounts of from 0 to 20% by weight, based on total composition.

Examples of impact modifiers include thermoset and thermoplastic materials having a $T_g$ of 50° C. or less, including core-shell rubber particles. Suitable compounds include polyacrylates, polymerized THF (tetrahydrofuran), carboxy-terminated butyronitrile rubber, and polypropylene glycol. When present, these compounds may be in an amount of from about 10 to about 20 weight percent of the total composition.

Suitable flame retardants may include halogenated materials, organic phosphates, and combinations thereof, and may be used in amounts of from 0 to 25% by weight based on total composition Suitable additional accelerators include imidazoles and the reaction products of diglycidyl ether of bisphenol A with polyamines or with imidazoles.

The disclosed curable compositions may be prepared, for example, by simultaneously or separately agitating, dissolving, mixing and dispersing the binder (i), and curing agent (ii), as well as optional components such as catalysts (iii) and those described above. The device for mixing, agitating, and dispersing is not critical although, an attritor, three-roll mill, ball mill, planetary mixer or ultrasonic mixer each equipped with agitating and heating means may generally be used. A suitable combination of these devices may also be useful.

The disclosed curable compositions may generally be characterized by a rheology suitable for use in integrated circuit manufacturing processes, especially flip chip manufacturing employing underfill processes. In general, the disclosed curable compositions will be in a liquid phase at least one temperature in a range of from 25° C. to 270° C. In one embodiment, the disclosed curable compositions will have a viscosity of from 20 cps to 30,000 cps at a temperature in the range of from 25 to 100° C.

The disclosed compositions may also be characterized by glass transition temperatures ($T_g$) of at least 100° C., while in another embodiment; the disclosed composition will have a $T_g$ of less than 250° C. In one exemplary embodiment, the disclosed composition will have $T_g$ of from about 150° C. to about 190° C., while in an especially exemplary embodiment; the disclosed composition will have $T_g$ of from about 155° C. to about 175° C.

When cured, the disclosed curable compositions will have a low CTE. CTE as used herein generally refers to the coefficient of thermal expansion as measured before $T_g$, i.e., $\alpha_1$. The CTE of a cured material may be evaluated using a TMA instrument from TA Instruments, such as Model 2940. CTE is evaluated after the disclosed curable compositions have been applied to a substrate and cured in a reasonable curing profile. In general, reasonable curing profiles are those employed in commercial flip chip manufacturing processes. Illustrative reasonable curing profiles include those wherein an applied composition is cured for a time of from about 5 minutes to several hours at temperatures of from about 100 to 240° C., while more preferred reasonable curing profiles include times of from 20 minutes to 60 minutes at temperatures of from 160-220° C. In one exemplary embodiment, the cure profile will be for a time of about 60 minutes at a temperature of about 150° C. In one particularly exemplary embodiment, the curing profile will comprise solder reflow conditions followed by post curing at a temperature between 120-180° C. and preferably at a temperature between 150-170° C.

The term 'low' CTE as used herein generally refers to CTEs of no more than about 60 ppm/° C. In one embodiment, the disclosed curable compositions will provide a cured composition having a CTE of from 15 to less than 60 ppm/° C. In another embodiment, the disclosed curable compositions will provide a cured composition having a CTE of from 35 to less than 55 ppm/° C. In another exemplary embodiment, the disclosed curable compositions will provide a cured composition having a CTE of from about 40 to about 50 ppm/° C. In one exemplary embodiment, cured compositions having such low CTEs are obtained from the instantly disclosed curable compositions which are substantially free of traditional CTE lowering fillers.

Also disclosed is a method of making an integrated circuit ("IC"), especially a flip chip assembly, using the disclosed curable compositions as well as IC assemblies made from the disclosed method.

A flip chip is a surface mounted chip having connecting metal lines attached to pads on the underside of the chip. A chip or die is mounted on an IC substrate to form an IC assembly. A flip chip may be mounted on a package substrate and the resulting package mounted on a printed circuit board ("PCB"). A flip chip may also be mounted directly to a PCB.

FIG. 1 shows a cross-section of one embodiment of an IC assembly 100 as made and disclosed herein. Flip chip die 110 contains a plurality of flip chip bumps on a surface 112, one of which is shown as bump 115. The die 110 is mated to package substrate 120, which contains substrate bump 130 on substrate bump pad 125. A layer of solder resist 140 covers the substrate 120, while a layer of underfill material 135 fills the space 145 between substrate 120 and die 110. It will be appreciated that solder resist 140 is optional only and need not be employed in all embodiments.

Figure 2:
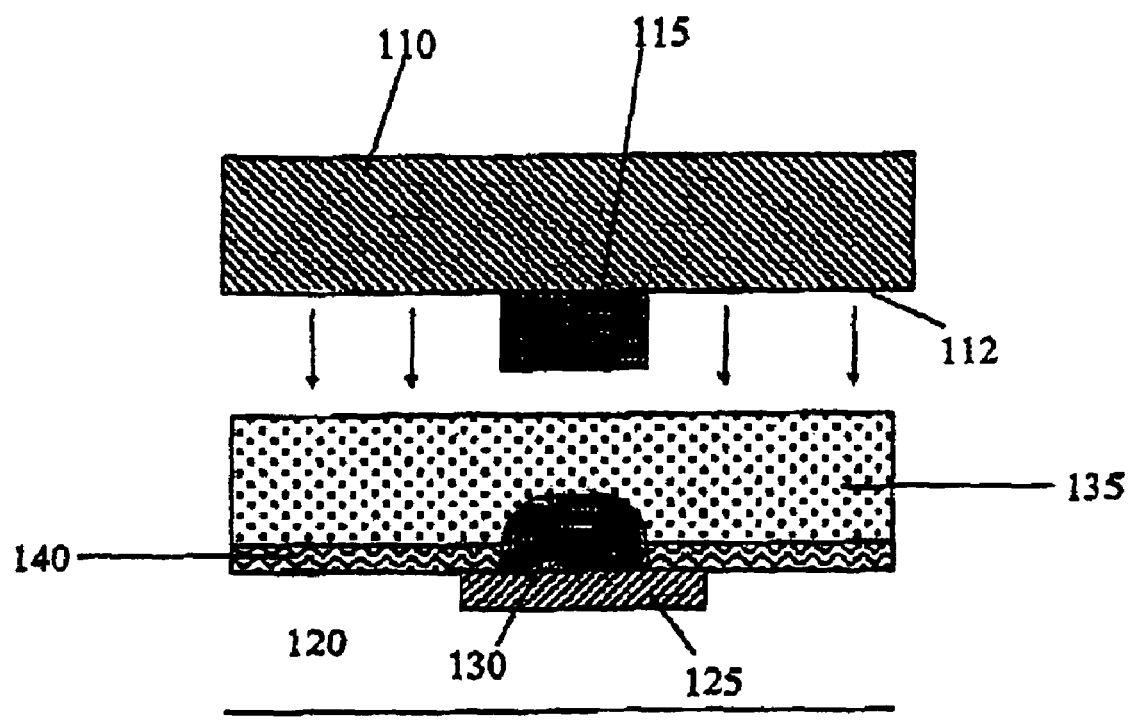
FIG. 2 is a cross-sectional view of an integrated circuit assembly made according to one embodiment of the disclosed method of making an integrated circuit assembly.

In general, the die 110 will have a surface 112 as illustrated in FIG. 2. The surface 112 will contain flip chip pads (not shown) and corresponding flip chip bumps 115. Prior to contact with the underfill material 135, the die surface 112 may be covered with an initial passivation layer and then a protective compliant layer, e.g., a thin (ca. 3 μm) layer of polyimide.

The flip chip bumps 115 may be of any suitable conductive material, e.g., eutectic SnPb solders, high Pb solders, lead free solders, Sn and Sn alloy solders, and metals such as Cu, Au, Ag, Ni, Sn, or suitable alloys thereof. In one embodiment, the flip chip bumper is copper. Any conventional copper used for IC connections may be used, e.g., by the Damascene process. In one embodiment, the flip chip bump material 115 will have a higher melting point than the substrate or package bump material 130.

The underfill material 135 of the IC assembly 100 in FIG. 1 is the curable composition disclosed herein that has been cured as discussed above.

The substrate 120 may be, e.g., a package substrate or PCB. The substrate 120 may include a ceramic, organic or metal core. The substrate 120 generally contains a substrate pad 125 and substrate bumps 130 in locations suitable for electronically mating to corresponding flip chip bumps 115.

The substrate bumps 130 are preferably bumps as discussed above in regards to flip chip bumps 115.

It will be appreciated that in FIGS. 1-4, the illustrated cross-sections represent one embodiment wherein the flip chip die 110 contains a plurality of bumps 115 and is one of many dies on a wafer. This allows for manufacturing many packages simultaneously. An individual die or wafer containing many dies 110, each with a plurality of bumps 115, may be joined to the package substrate 120.

In one embodiment, the disclosed method of making an IC assembly comprises applying the disclosed curable composition to a substrate 120, placing a die 110 in communication with the applied composition, and curing the applied composition to provide an assembly 100, wherein at least one of the substrate 125 or die 110 comprises one or more bumps 115 or 130. In one exemplary embodiment, both the substrate 125 and the die 110 will both comprise bumps 115 and 130. In one especially exemplary embodiment, the die 110 will be placed in communication with the applied composition such that the bumps 115 touch the bumps 130 and form an interconnection upon reflow of the bumps.

Thus, it will be appreciated that the disclosed method of making a flip chip assembly encompasses both conventional flip chip process employing capillary flow underfill as well as the more advantageous no capillary flow underflow or 'no flow' underfill processes.

In one exemplary embodiment, the disclosed method will employ a no flow underfill process as illustrated in FIG. 2. As illustrated in FIG. 2, an underfill material 135 has been applied to substrate 120, which comprises substrate bump 130 on substrate bump pad 125.

Various processes may be used to apply underfill material 135 to the wafer or package substrate 120. Examples of such processes include spin-on, dispense, coating (e.g., by brushing or spraying on a liquid), and lamination (e.g., by applying a solid film or sheet). In one embodiment, the underfill material 135 comprising the disclosed curable composition will be applied using a liquid application process such as dispense or coating.

The thickness of the applied underfill 135 is not limited and can be varied for specific applications as needed.

As illustrated in FIG. 2, the die 110 is joined to substrate 120 by pressing flip chip bumps 115 through underfill material 135 until flip chip bumps 115 make contact with substrate bumps 130. As noted above, this process can also occur at the wafer level, where the wafer contains a plurality of dies 110 each having a plurality of flip chip bumps 115. Package substrate 120 would then be part of a panel or sheet containing many substrate pads 125 and bumps 130 configured to mate with the flip chip bumps 115 on the wafer.

A chip join process attaches the die 110 to the IC substrate 120. In one embodiment, thermocompressive bonding effects the flip chip join process at the chip level. Alternatively, a wafer level process may be employed. If so, lamination bonding may be used to join a wafer containing applied underfill to a sheet or panel package substrate, e.g., a tape package or flex package.

Figure 3:
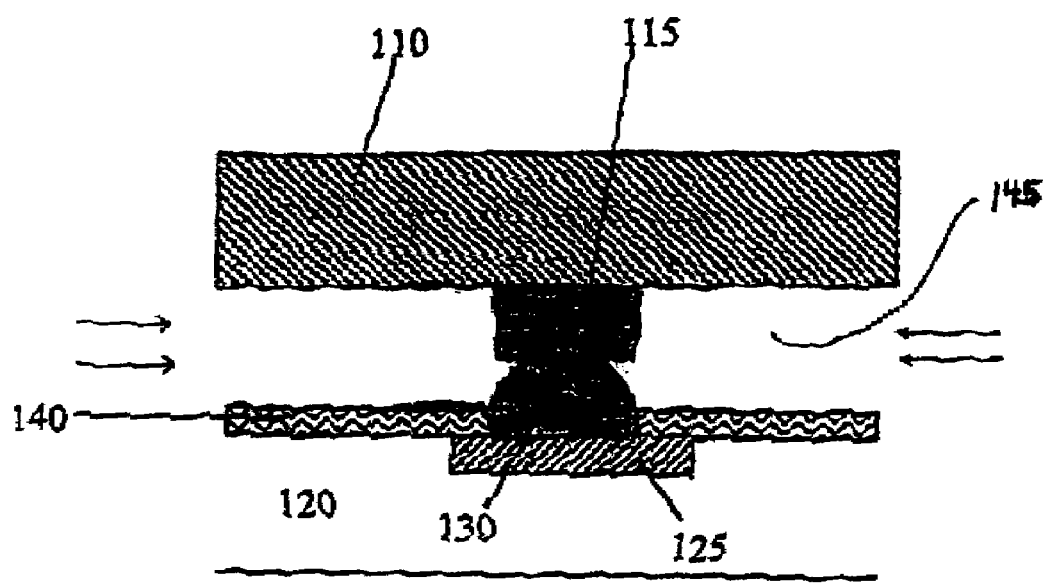
FIG. 3 is a cross-sectional view of an integrated circuit assembly made according to a second embodiment of the disclosed method of making an integrated circuit assembly.

In another embodiment, the disclosed method will employ a capillary flow underfill process as illustrated in FIG. 3. As illustrated in FIG. 3, an underfill material 135 is injected or dispersed via the direction of the arrows into the space 145 between die 110 and substrate 120. It will be appreciated that this process produces an IC assembly 110 as illustrated in FIG. 1.

In one embodiment, the disclosed method will comprise providing a substrate 120 comprising one or more bumps 130 thereon, applying a curable composition 135 to the substrate 120, said curable composition comprising (i) a binder comprising at least one epoxy compound of the structure:

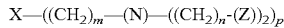

wherein X is an aromatic ring or a six membered cycloaliphatic ring, m is from about 0 to about 2, n is from about 1 to about 3, Z is an epoxy group of empirical formula: $C_2H_3O$, p is a number from about 2 to about 3, and (ii) a cross-linking agent comprising at least one polyamine, placing a die 110 on the applied curable composition, said die 110 comprising one or more bumps 115, subjecting the assembly to a temperature sufficient to cause flow and joining of the bumps, and subjecting the assembly to a temperature sufficient to cause curing of the applied curable composition 135.

In one embodiment, the steps of subjecting the assembly to a temperature sufficient to cause flow of the bumps and subjecting the assembly to a temperature sufficient to cause curing of the applied curable composition 135 occur simultaneously. That is, in this embodiment, the formation of the interconnection between the bumps 115 and 130 as a result of the solder reflow occurs simultaneously with crosslinking in the underfill material 135.

In another embodiment, the bulk of the crosslinking of the curable composition occurs after the onset of solder reflow of the bumps 115 and 130. In this case, the bumps will begin to flow and form the desired interconnection such that the bumps 115 and 130 are joined before crosslinking of the underfill material 135 is completed. In one exemplary embodiment, the crosslinking of the underfill material 135 will progress rapidly once crosslinking begins.

In one embodiment, the disclosed integrated circuit assembly comprises a substrate comprising one or more substrate bumps, a die having an active side comprising one or more flip chip bumps, said die being in communication with the substrate such that the substrate bumps are joined to the flip chip bumps, and a cured composition in communication with the substrate and the die, and surrounding the joined bumps, the cured composition having a CTE of no more than 60 ppm/° C. and comprising the reaction product of a binder (i) comprising at least one epoxy compound of the structure:

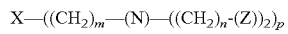

wherein X is an aromatic ring or a six membered cycloaliphatic ring, m is from about 0 to about 2, n is from about 1 to about 3, Z is an epoxy group of empirical formula: $C_2H_3O$, p is a number from about 2 to about 3, and a crosslinking agent (ii) comprising at least one polyamine.

The disclosed circuit assemblies may used in a variety of electronic applications given their improvements in interconnection reliability, decreased cost, and resistance to thermal cycling. In one exemplary embodiment, the disclosed integrated circuit assemblies will be used on motor vehicles, especially in applications requiring proximity to vehicle operating temperatures of at least 150° C., such as applications close to or in an internal combustion engine.

EXAMPLES

Components and Materials used in the Preparation of the Disclosed Curable Compositions Table I provides the short names and chemical compositions of illustrative materials used to make the curable compositions of Tables I, II, and III.

TABLE 1

| Product Name | Chemical Composition |
|---|---|
| TGMX | Tetraglycidyl meta-Xylenediamine |
| APB | 1,3-Bis(3-aminophenoxy)benzene |
| 1,3-4 APB | 1,3-Bis(4-aminophenoxy)benzene |
| 1,4-4 APB | 1,4-Bis(4-aminophenoxy)benzene |
| ASD | 4,4'-diaminodiphenyl sulfide |
| 2,4-DAT | 2,4-diaminotoluene |
| Ancamine* ™ Z | A mixture of: |
| | 1,3-benzenediamine |
| | 4,4'-diaminodiphenyl methane |
| | 1-[(3-aminophenyl)amino]-3-phenoxy and |
| | 1-[[4-[(4-aminophenyl) methyl] phenyl] amino]-3-phenoxy- |
| Ancamine* ™ Y | A mixture of: |
| | 4,4'-diaminodiphenyl methane |
| | Polymeric methylene dianiline |
| | 3,4-diaminotoluene, 2,3-diaminotoluene and 2,4-diaminotoluene |
| 1,3-PDA | 1,3-phenylenediamine |
| DAB | Diaminobenzidine |
| FC520 | Diethylamine triflate (60% solution) |
| Anchor1040* ™ | Modified amine complex of boron trifluoride |
| 1,5-DAN | 1.5-Diaminonaphthalene |
| 1,8-DAN | 1.5-Diaminonaphtalene |

*Footnote:
Ancamine Y and Z and Anchor 1040 are available from Air Products of Allentown, PA.

Differential scanning calorimetry (DSC) was used to determine the peak maxima of the cure exotherm for all prepared compositions. The reported coefficient of thermal expansions and glass transition temperatures were measured by thermomechanical analysis (TMA). Specimens for the TMA analysis were prepared by sanding the cured composition using a #400 grit SiC sand paper.

Preparation of the Disclosed Curable Compositions,
Formulas 1-20.

For each of formulas 1-20, a known amount of the polyamine was heated above its melting point of 112° C. and supercooled to room temperature where it remained in the liquid state. To this was added a stoichiometric or near stoichiometric amount of TGMX epoxy resin at room temperature with continuous stirring until a homogeneous mixture was formed.

A solution mixture of selected metal triflate catalyst and glycerol at a 1:1 weight ratio was heated with stirring until the triflate salt was dissolved. The appropriate amount of triflate salt/glycerol viscous solution (Tables II, III, and IV give the triflate salt percent by weight of total composition) was then mixed thoroughly with the TGMX/polyamine liquid solution. The mixture was degassed under vacuum for a short period of time. The formulation was then cast into a mold or film and cured at a temperature of 150° C. for 3 hours.

Table II shows the CTE, $T_g$ and peak cure exotherm temperatures of formulas 1-20 of the disclosed curable compositions.

TABLE II

| Formula | Amine | Triflate Salt (% by Wt) | CTE (μm/m ° C.) | $T_g$ (° C.) | $T_{max}$ (° C.) |
| --- | --- | --- | --- | --- | --- |
| 1 | APB | — | 42 | 160 | 216 |
| 2 | APB | Li (0.5%) | 44 | 155 | 183 |
| 3 | APB | Li (0.5%)/Glycerol | 48 | 155 | 178 |
| 4 | APB | Ce (0.5%) | 46 | 162 | 189 |
| 5 | APB | Ce (0.5%)/Glycerol | 47 | 155 | 170 |
| 6 | APB | Ce (1%)/Glycerol | 49 | 160 | 173 |
| 7 | — | Ce (6.0%)/Glycerol | — | — | 276 |
| 8 | APB | La (0.5%)/Glycerol | 46 | 160 | 175 |
| 9 | APB | La (1%)/Glycerol | 39 | 160 | 172 |
| 10 | APB | La (0.5%) | 43 | 154 | 194 |
| 11 | APB | Nd (0.5%)/Glycerol | 47 | 162 | 180 |
| 12 | APB | Nd (1%)/Glycerol | 53 | 171 | 165 |
| 13 | APB | Eu (0.5%)/Glycerol | 48 | 160 | 176 |
| 14 | APB | Eu (1%)/Glycerol | 51 | 162 | 172 |
| 15 | APB | Yb (0.5%)/Glycerol | 50 | 160 | 170 |
| 16 | APB | Yb (1%)/Glycerol | 48 | 163 | 166 |
| 17 | APB | FC520 (0.5%) | 47 | 160 | 200 |
| 18 | APB | FC520 (1%) | 47 | 158 | 189 |
| 19 | APB | FC520 (2%) | 47 | 158 | 176 |
| 20 | APB | Anchor 1040 (1%) | 48 | 160 | 175 |

Li = Lithium, Ce = Cerium, La = Lanthanum, Nd = Neodymium, Eu = Europium, Yb = Ytterbium Preparation of the Disclosed Curable Compositions,
Formulas 21-29

Curable compositions using a solid polyamine as the at least one polyamine were prepared. Each solid polyamine curing agent employed per Table III below was first liquefied by heating near its melting point. The liquified polyamine was then added with vigorous stirring to a stoichiometric or near stoichiometric amount of preheated TGMX epoxy resin (resin temperature was lower or similar to the melting temperature of the amine). The homogeneous mixture was then quickly cooled to room temperature to prolong its pot life. When a catalyst was necessary, it was added to the above epoxy/amine solution and mixed thoroughly at room temperature. In some cases, the formulation was degassed under dynamic vacuum at a temperature not exceeding 60° C. for a short period of time. The liquid composition was then cast and cured at 150° C. for 3 hours. Table III shows CTE, $T_g$ and peak cure exotherm temperatures of several formulations using various solid amine curing agents.

TABLE III

| Formula | Amine | Triflate Salt (% by Wt) | CTE (μm/m ° C.) | $T_g$ (° C.) | $T_{max}$ (° C.) |
| --- | --- | --- | --- | --- | --- |
| 21 | ASD | — | 48 | 165 | 208 |
| 22 | ASD | Ce (0.5%)/Glycerol | 49 | 160 | 172 |
| 23 | 1,3-4 APB | — | 60 | 175 | 197 |
| 24 | 1,3-4 APB | Ce (0.5%)/Glycerol | 52 | 180 | 172 |
| 25 | 2,4-DAT | La (1%)/Glycerol | 52 | 180 | 151 |
| 26 | 1,3-PDA | — | 39 | 175 | 173 |
| 27 | DAB | — | 54 | >150 | 168 |
| 28 | 1,5-DAN | Ce (0.5%)/Glycerol | 48 | 180 | 177 |
| 29 | 1,8-DAN | Ce (0.5%)/Glycerol | 49 | 180 | 193 |

Preparation of the Disclosed Curable Compositions,
Formulas 30-32

Curable compositions using liquid aromatic amine mixtures as the at least one polyamine were prepared using the materials set forth in Table IV. The liquid aromatic polyamine mixtures were mixed thoroughly at room temperature with stoichiometric or near stoichiometric amounts of TGMX epoxy resin followed by addition of the triflate salt catalyst if used. The thoroughly mixed formulations were then degassed for a period of time under vacuum at room temperature and than cast and cured as in the previous examples. The CTE, $T_g$ and the exotherm maxima for representative TGMX/liquid amine mixture formulations are given in Table IV.

TABLE IV

| Formula | Amine | Triflate Salt (% by Wt) | CTE (μm/m ° C.) | $T_g$ (° C.) | $T_{max}$ (° C.) |
| --- | --- | --- | --- | --- | --- |
| 30 | Ancamine Z | — | 41 | 190 | 176 |
| 31 | Ancamine Y | — | 52 | 170 | 183 |
| 32 | Ancamine Y | La (0.5%)/Glycerol | 51 | 180 | 155 |

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A curable composition, comprising
(i) a binder comprising at least one epoxy compound of the structure:

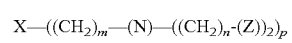

X—((CH$_2$)$_m$—(N)—((CH$_2$)$_n$-(Z))$_2$)$_p$ wherein X is an aromatic ring or a six membered cycloaliphatic ring, m is from about 0 to about 2, n is from about 1 to about 3, Z is an epoxy group of empirical formula C2H3O, p is a number from about 2 to about 3, and (ii) a cross-linking agent comprising at least one of 1,3-bis (3-aminophenoxy)benzene, 1,3-bis(4-aminophenoxy) benzene, or 1,4-bis(4-aminophenoxy)benzene, wherein the curable composition has a coefficient of thermal expansion (CTE) of no more than 60 ppm/° C. when cured for a time of from about 20 to about 60 minutes at temperature of from about 100 to 240° C.

2. The curable composition of claim 1 comprising no more than 20% by weight of traditional CTE lowering fillers, based on the total nonvolatile weight of curable composition.

3. The curable composition of claim 2 that is substantially without traditional CTE lowering fillers.

4. The curable composition of claim 1 wherein the binder comprises at least one epoxy compound of the structure:

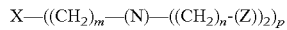

$$X\text{---}((CH_2)_m\text{---}(N)\text{---}((CH_2)_n\text{-}(Z))_2)_p$$

wherein X is an aromatic ring, m is from 0 to about 1, and n is from about 1 to 2.

5. The curable composition of claim 4 wherein the at least one epoxy compound is N, N, N', N'-tetraglycidyl-meta-xylenediamine.

6. The curable composition of claim 1 further comprising a catalyst (iii).

7. The curable composition of claim 1 further comprising at least one of additives, accelerators, diluents, coupling agents, adhesion agents, fluxing agents, impact modifiers, aliphatic amines, stabilizers, antioxidants, antifoaming agents, flame retardants, and combinations comprising two or more of the foregoing.

* * * * *